US00RE39824E

(19) United States
(12) Reissued Patent
Kato et al.

(10) Patent Number: US RE39,824 E
(45) Date of Reissued Patent: Sep. 11, 2007

(54) VACUUM PROCESSING APPARATUS AND OPERATING METHOD WITH WAFERS, SUBSTRATES AND/OR SEMICONDUCTORS

(75) Inventors: Shigekazu Kato, Kudamatsu (JP); Kouji Nishihata, Tokuyama (JP); Tsuenhiko Tsubone, Hikari (JP); Atsushi Itou, Kudamatsu (JP)

(73) Assignee: Hitachi, Ltd., Tokyo (JP)

(21) Appl. No.: 10/062,088
(22) Filed: Sep. 23, 2002

Related U.S. Patent Documents

Reissue of:
(64) Patent No.: 6,314,658
Issued: Nov. 13, 2001
Appl. No.: 09/725,257
Filed: Nov. 29, 2000

U.S. Applications:
(63) Continuation of application No. 09/552,572, filed on Apr. 19, 2000, now Pat. No. 6,301,801, which is a division of application No. 09/461,432, filed on Dec. 16, 1999, now Pat. No. 6,330,755, which is a continuation of application No. 09/177,495, filed on Oct. 23, 1998, now Pat. No. 6,012,235, which is a continuation of application No. 09/061,062, filed on Apr. 16, 1998, now Pat. No. 5,950,330, which is a continuation of application No. 08/882,731, filed on Jun. 26, 1997, now Pat. No. 5,784,799, which is a division of application No. 08/593,870, filed on Jan. 30, 1996, now Pat. No. 5,661,913, which is a continuation of application No. 08/443,039, filed on May 17, 1995, now Pat. No. 5,553,396, which is a division of application No. 08/302,443, filed on Sep. 9, 1994, now Pat. No. 5,457,896, which is a continuation of application No. 08/096,256, filed on Jul. 26, 1993, now Pat. No. 5,349,762, which is a continuation of application No. 07/751,951, filed on Aug. 29, 1991, now Pat. No. 5,314,509.

(30) Foreign Application Priority Data

Aug. 29, 1990 (JP) ..... 02-255321

(51) Int. Cl.
*F26B 5/04* (2006.01)
*B08B 3/00* (2006.01)

(52) U.S. Cl. ..... 34/406; 34/92; 414/225; 134/902

(58) Field of Classification Search ..... 34/406, 34/409, 413, 417; 414/939, 940, 225, 226, 414/331, 416; 134/902; 156/345, 345 C; 118/723 F, 723 I, 730, 719
See application file for complete search history.

(56) References Cited

U.S. PATENT DOCUMENTS 3,652,444 A * 3/1972 Lester et al.
(Continued)

FOREIGN PATENT DOCUMENTS

EP 20246453 * 4/1987
(Continued)

OTHER PUBLICATIONS

Semicon News, Apr. 1987 (pp. 38–43) (PTR).

(Continued)

*Primary Examiner*—Ira S. Lazarus
*Assistant Examiner*—Kathryn S. O'Malley
(74) *Attorney, Agent, or Firm*—Antonelli, Terry, Stout and Kraus, LLP.

(57) ABSTRACT

This invention relates to a vacuum processing apparatus having vacuum processing chambers the insides of which must be dry cleaned, and to a method of operating such an apparatus. When the vacuum processing chamber are dry-cleaned, dummy substrates are transferred into the vacuum processing chamber by substrates conveyor means from dummy substrate storage means which is disposed in the air atmosphere together with storage means for storing substrates to be processed, and the inside of the vacuum processing chamber is dry-cleaned by generating a plasma. The dummy substrate is returned to the dummy substrate storage means after dry cleaning is completed. Accordingly, any specific mechanism for only the cleaning purpose is not necessary and the construction of the apparatus can be made simple. Furthermore, the dummy substrates used for dry cleaning and the substrates to be processed do not coexist, contamination of the substrates to be processed due to dust and remaining gas can be prevented and the production yield can be high.

25 Claims, 1 Drawing Sheet

U.S. PATENT DOCUMENTS

| | | | | | |
|---|---|---|---|---|---|
| 3,981,791 | A | * | 9/1976 | Rosvold | |
| 4,138,306 | A | * | 2/1979 | Niwa | 156/345 |
| 4,226,897 | A | * | 10/1980 | Coleman | |
| 4,311,427 | A | * | 1/1982 | Coad et al. | |
| 4,313,783 | A | * | 2/1982 | Davies et al. | |
| 4,313,815 | A | * | 2/1982 | Graves, Jr. et al. | |
| 4,318,767 | A | * | 3/1982 | Hijikata et al. | |
| 4,449,885 | A | * | 5/1984 | Hertel et al. | |
| 4,457,661 | A | * | 7/1984 | Flint et al. | |
| 4,534,314 | A | * | 8/1985 | Ackley | |
| 4,563,240 | A | * | 1/1986 | Shibata et al. | |
| 4,576,698 | A | * | 3/1986 | Gallagher et al. | 204/192 |
| 4,634,331 | A | * | 1/1987 | Hertel | |
| 4,643,629 | A | | 2/1987 | Takahashi et al. | |
| 4,705,951 | A | * | 11/1987 | Layman et al. | |
| 4,715,764 | A | * | 12/1987 | Hutchinson | |
| 4,824,309 | A | * | 4/1989 | Kakehi et al. | 414/217 |
| 4,836,733 | A | * | 6/1989 | Hertel et al. | |
| 4,836,905 | A | | 6/1989 | Davis et al. | |
| 4,851,101 | A | * | 7/1989 | Hutchinson | |
| 4,895,107 | A | * | 1/1990 | Yano et al. | |
| 4,902,934 | A | * | 2/1990 | Miyamura et al. | |
| 4,903,937 | A | * | 2/1990 | Jakuniec et al. | |
| 4,909,695 | A | * | 3/1990 | Hurwitt et al. | |
| 4,911,597 | A | * | 3/1990 | Maydan et al. | |
| 4,915,564 | A | * | 4/1990 | Eror et al. | |
| 4,917,556 | A | | 4/1990 | Stark et al. | |
| 4,923,584 | A | | 5/1990 | Bramhall, Jr. et al. | |
| 4,924,890 | A | * | 5/1990 | Giles et al. | 134/902 |
| 4,936,329 | A | * | 6/1990 | Michael et al. | 134/902 |
| 4,951,601 | A | * | 8/1990 | Maydan et al. | 414/217 X |
| 4,969,790 | A | | 11/1990 | Petz et al. | |
| 5,007,981 | A | * | 4/1991 | Kawasaki et al. | |
| 5,014,217 | A | * | 5/1991 | Savage | 364/550 |
| 5,186,718 | A | | 2/1993 | Tepman et al. | |
| 5,292,393 | A | * | 3/1994 | Maydan et al. | |
| 5,351,415 | A | * | 10/1994 | Brooks et al. | 34/389 |
| 5,436,848 | A | * | 7/1995 | Nishida et al. | |
| 5,452,166 | A | * | 9/1995 | Aylwin et al. | |
| 5,462,397 | A | * | 10/1995 | Iwabuchi | 414/222 |
| 5,504,033 | A | * | 4/1996 | Bajor et al. | |
| 5,504,347 | A | * | 4/1996 | Jovanovic et al. | |
| 5,509,771 | A | * | 4/1996 | Hiroki | 414/217 |
| 5,556,714 | A | * | 9/1996 | Fukuyama et al. | |
| 5,651,858 | A | * | 7/1997 | Lin | |
| 5,675,461 | A | * | 10/1997 | Aylwin et al. | |
| 5,685,684 | A | * | 11/1997 | Kato et al. | 414/217 |

FOREIGN PATENT DOCUMENTS

| | | | |
|---|---|---|---|
| EP | 0246453 | | 11/1987 |
| EP | 20381338 | * | 5/1990 |
| EP | 0381338 | | 8/1990 |
| JP | 57-29577 | | 2/1982 |
| JP | 58-93321 | | 6/1983 |
| JP | 58-95636 | | 6/1983 |
| JP | 58-108641 | | 6/1983 |
| JP | 59-094435 | | 5/1984 |
| JP | 60-52574 | | 3/1985 |
| JP | 60-246635 | | 12/1985 |
| JP | SHO-61-173445 | | 8/1986 |
| JP | 61-250185 | | 11/1986 |
| JP | 62-44571 | | 2/1987 |
| JP | 62-50463 | | 3/1987 |
| JP | 6289881 | * | 4/1987 |
| JP | 62-132321 | | 6/1987 |
| JP | 62-207866 | | 9/1987 |
| JP | 62-216315 | | 9/1987 |
| JP | 63-57734 | | 4/1988 |
| JP | 63-133521 | | 6/1988 |
| JP | 63-153270 | | 6/1988 |
| JP | 636582 | * | 1/1989 |
| JP | 6412037 | * | 1/1989 |
| JP | 64-500072 | | 1/1989 |
| JP | 131970 | * | 2/1989 |
| JP | 131971 | * | 2/1989 |
| JP | 1-120811 | | 5/1989 |
| JP | 1-135015 | | 5/1989 |
| JP | 1-170013 | | 6/1989 |
| JP | 1-251734 | | 10/1989 |
| JP | 1-258438 | | 10/1989 |
| JP | 1-298180 | | 12/1989 |
| JP | 1-310553 | | 12/1989 |
| JP | 1-316957 | | 12/1989 |
| JP | 2-52449 | | 2/1990 |
| JP | 02-065252 | | 3/1990 |
| JP | 2-94647 | | 4/1990 |
| JP | 2-106037 | | 4/1990 |
| JP | 2-178946 | | 7/1990 |
| JP | 02-178946 | | 7/1990 |
| JP | 2-224242 | | 9/1990 |
| JP | 2-61064 | | 12/1990 |
| JP | 3-19252 | | 1/1991 |
| JP | 430549 | * | 4/1992 |
| JP | 4-82841 | | 7/1992 |
| JP | 63-153270 | | 6/1998 |
| WO | 8707309 | * | 5/1987 |
| WO | 87/07309 | | 12/1987 |

OTHER PUBLICATIONS

VLSI Processing Equipment handbook, Ph. D. Kazuo Maeda (6–90), pp. 158 (PTR).

Latest trend of process automation (Realize, Inc.) (1986), pp. 202 and 203.

Semicon News, Semicon/East '84, Dec 1984, vol. 13., p. 199.

"Semiconductor World", Sep. 1990, Published by Press Journal, Inc., pp. 136–137 (FTR).

Electronic Parts and Materials, 1989, vol. 28, No. 3, pp. 22–29.

Solid State Technology, Oct. 1990, pp. 35–41.

Solid State Technology, Dec. 1990, pp. 37–47.

Semiconductor World, pp. 106–111, Sep. 1990.

Semiconductor World, pp. 122–125, Sep. 1990.

Semiconductor World, pp. pp. 110–113, Oct. 1989.

Semiconductor World, pp. 52–53, Aug. 1991.

European Search Report, Jan. 1992, re 91307625.3.

European Search Report, Apr. 1998, re 97111628.0.

European Search Report, Mar. 1999, re 981061625.

JP application No. 3–234408, Notification of Reasons for Refusal, Jan. 28, 1997 (TR).

JP application No. 2646905, Notification Reasons for Revocation Dec. 15, 1998 (TR).

JP application No. 2646905, Notice of Reasons for Revocation Jul. 21, 1999 (TR).

Decision for Patent Opposition, Opposition No. 10–70995 (Oct. 1999) (TR).

JP application No. 2–225321, Notification of Reasons for Refusal Oct. 15, 1996 (TR).

JP application No. 8–335329, Interview Record (TR).

JP application No. 8–335329, Notification of Reasons for Refusal Sep. 30, 1997 (TR).

JP application No. 8–335329, Notification of Reasons for Refusal Apr. 7, 1998 (TR).

JP patent No. 2816139, Notice of Reasons for Revocation Nov. 21, 1999 (TR).

Official Decision on Opposition to Grant of Patent 1999–71584 Jan. 12, 2001 (TR).
JP application No. 9–329873, Notification of Reasons for Refusal Jul. 14, 1998 (TR).
JP application No. 9–329873, Notification of Reasons for Refusal Nov. 10, 1999 (TR).
JP Patent No. 2942527, Notice of Reasons for Revocation Jun. 27, 2000 (TR).
Decision on Opposition to the Grant of a Patent 2000–70844 Jan. 12, 2001 (TR).
JP application No. 11–001263, Notification of Reasons for Refusal Feb. 2, 2000 (TR).
JP application No. 2000–05449, Notification of Reasons for Refusal Sep. 6, 2000 (TR).
JP application No. 2000–054450, Notification of Reasons for Refusal Sep. 6, 2000 (TR).
JP application No. 2000–054451, Notification of Reasons for Refusal Sep. 6, 2000 (TR).
JP application No. 2000–054452, Notification of Reasons for Refusal Sep. 6, 2000 (TR).
EP9130625, Office Action Oct. 11, 1993.
EP91307625, Summons to attend oral proceedings Dec. 9, 1999.
EP91307625, Communication of a notice of opposition Nov. 19, 1998.
EP91307625, Interlocutory decision in Opposition proceedings, May 16, 2000.
EP91307625, Minutes of the oral proceedings, Mar. 9, 2000.
EP97111628, Office action Dec. 1999.
EP97111628, Office action Nov. 2000.
EP97111628, Office action Jun. 2001.
EP98106162, Office action Nov. 2000.
EP98106162, Office action Jun. 2001.
KR application No. 14984/91, Preliminary Notice of Ground(s) for Rejection (TR).
KR application No. 184682–00–00, Notice of Decision on Opposition to the Granted Patent Oct. 4, 2000 (TR).
KR application No. 184682, Trial Decision Aug. 1, 2000 (TR).
KR application No. 46756/98, Preliminary Notice of Ground(s) for Rejection Jan. 20, 1999 (TR).
KR application No. 212874, Dec. 22, 2000, Notice of Decision on Opposition to the Granted Patent.
KR application No. 46757/98, Preliminary Notice of Ground(s) for Rejection Jan. 20, 1999 (TR).
KR application No. 212819, Dec. 22, 2000, Notice of Decision on Opposition to the Granted Patent (TR).
JP patent No. 314359, Notice of Reasons for Revocation Dec. 18, 2001 (TR).
JP patent No. 314375, Notice of Reasons for Revocation Dec. 18, 2001 (TR).
JP patent No. 3145375, Notice of Reasons for Revocation Dec. 18, 2001 (TR).
JP patent No. 3147230, Notice of Reasons for Revocation Dec. 18, 2001 (TR).
JP application No. 2000–338177, Decision of Refusal Apr. 16, 2002 (FTR).
Office Action dated Sep. 3, 2002, in corresponding Japanese Patent Application 2000–040579.
Decision of the Tokyo High Court, Case No. 58, on oral proceedings, dated Sep. 17, 2002.
Office Action dated Sep. 3, 2002, in corresponding Japanese Patent Application 2000–040580.
Decision on Opposition No. 2001.72514 relating to JP 3145359, Patentee Hitachi, Ltd., pp. 1–27, Nov. 20, 2002.
Decision on Opposition No. 2001.72518 relating to JP 3145375, Patentee Hitachi, Ltd., pp. 1–28, Nov. 20, 2002.
Decision on Opposition No. 2001.72519 relating to JP 3145376, Patentee Hitachi, Ltd., pp. 1–23, Nov. 20, 2002.
Decision on Opposition No. 2001.72574 relating to JP 3147230, Patentee Hitachi, Ltd., pp. 1–22, Nov. 20, 2002.
R.P.H. Chang, "Multipurpose plasma reactor for materials research and processing", J. Vac. Sci. Technol., vol. 14, No. 1, Jan./Feb. 1977, pp. 278–280.*

* cited by examiner

VACUUM PROCESSING APPARATUS AND OPERATING METHOD WITH WAFERS, SUBSTRATES AND/OR SEMICONDUCTORS

Matter enclosed in heavy brackets [ ] appears in the original patent but forms no part of this reissue specification; matter printed in italics indicates the additions made by reissue.

This application is a Continuation application of application Ser. No. 09/552,572, filed Apr. 19, 2000, which is a Divisional application of application Ser. No. 09/461,432, filed Dec. 16, 1999 [now abandoned] *now U.S. Pat. No. 6,330,755*, which is a Continuation application of application Ser. No. 09/177,495, filed Oct. 23, 1998 now U.S. Pat. No. 6,012,235, which is a Continuation application of application Ser. No. 09/061,062, filed Apr. 16, 1998 now U.S. Pat. No. 5,950,330, which is a Continuation application of application Ser. No. 08/882,731, filed Jun. 26, 1997 now U.S. Pat. No. 5,784,799, which is a Divisional application of application Ser. No. 08/593,870, filed Jan. 30, 1996 now U.S. Pat. No. 5,661,913, which is a Continuing application of application Ser. No. 08/443,039, filed May 17, 1995 now U.S. Pat. No. 5,553,396, which is a Divisional application of application Ser. No. 08/302,443, filed Sep. 9, 1994 now U.S. Pat. No. 5,457,896 which is a Continuing application of application Ser. No. 08/096,256, filed Jul. 26, 1993 now U.S. Pat. No. 5,349,762, which is a Continuing application of application Ser. No. 07/751,951, filed Aug. 29, 1991 now U.S. Pat. No. 5,314,509.

BACKGROUND OF THE INVENTION

1. Field of the Invention

This invention relates to a vacuum processing apparatus and operating method therefor. More specifically, the present invention relates to a vacuum processing apparatus having vacuum processing chambers the inside of which must be cleaned, and its operating method.

2. Description of the Prior Art

In a vacuum processing apparatus such as a dry etching apparatus, a CVD apparatus or a sputtering apparatus, a predetermined number of substrates to be treated are stored as one unit (which is generally referred to as a "lot") in a substrate cassette and are loaded in the apparatus. The substrates after being processed are likewise stored in the same unit in the substrate cassette and are recovered. This is an ordinary method of operating these apparatuses to improve the productivity.

In such a vacuum processing apparatus described above, particularly in an apparatus which utilizes a reaction by an active gas, as typified by a dry etching apparatus and a CVD apparatus, reaction products adhere to and are deposited on a vacuum processing chamber with the progress of processing. For this reason, problems such as degradation of vacuum performance, the increase of dust, the drop of the levels of optical monitoring signals occur. To solve these problems, conventionally the insides of the vacuum processing chambers are cleaned periodically. Cleaning operations include so-called "wet cleaning" which is wiping-off of the adhering matters by use of an organic solvent, etc., and so-called "dry cleaning" in which an active gas or plasma is used for decomposing adhering matters. Dry cleaning is superior from the aspect of the working factor and efficiency. These features of the dry cleaning have become essential with the progress in automation of production lines.

An example of vacuum processing apparatuses having such a dry cleaning function is disclosed in Japanese Utility Model Laid-Open No. 127125/1988. This apparatus includes a preliminary vacuum chamber for introducing wafers to be treated into a processing chamber from an atmospheric side to a vacuum side, which is disposed adjacent to the processing chamber through a gate valve, dummy wafers are loaded in the preliminary vacuum chamber and are transferred into the processing chamber by exclusive conveyor means before the processing chamber is subjected to dry cleaning, and the dummy wafer is returned to the vacuum preparatory chamber by the conveyor means after dry cleaning is completed.

SUMMARY OF THE INVENTION

In the prior art technology described above, the structure of the vacuum processing apparatus is not much considered. The preliminary vacuum chamber for storing the dummy wafers must have a large capacity, the exclusive conveyor means is necessary for transferring the dummy wafers and thus, the apparatus is complicated in structure.

Dummy wafers used for plasma cleaning are again returned to the preliminary vacuum chamber and are made to stand by. In this instance, reaction products generated during plasma cleaning and residual gas used for plasma cleaning adhere on the used dummy wafers. Thereafter, normal processing for wafers is resumed. Therefore, the used dummy wafers and unprocessed wafers exist in mixture inside the preliminary vacuum chamber and this state is not desirable from the aspect of contamination of unprocessed wafers.

The present invention provides a vacuum processing apparatus which solves the problems described above, is simple in structure, prevents contamination of unprocessed substrates and accomplishes a high production yield. A vacuum processing apparatus having vacuum processing chambers the insides of which are dry-cleaned after substrates to be treated are processed in vacuum is provided with first storage means for storing substrates to be treated, second storage means for storing dummy substrates, the first and second storage means being disposed in the air, conveyor means for transferring the substrates to be processed between the first storage means and the vacuum processing chambers and for transferring the dummy substrates between the second storage means and the vacuum processing chambers, and control means for controlling the conveyor means so as to transfer the dummy substrates between the second storage means and the vacuum processing chambers before and after dry cleaning of the vacuum processing chambers. A method of operating a vacuum processing apparatus having vacuum processing chambers the insides of which are dry-cleaned after substrates to be processed are processed in vacuum comprises the steps of disposing first storage means for storing the substrates to be processed together with second storage means for storing dummy substrates in the air atmosphere, transferring the substrates to be processed between the first storage means and the vacuum processing chambers and vacuum-processing the substrates to be processed, and transferring the dummy substrates between the second storage means and the vacuum processing chambers before and after dry-cleaning of the vacuum processing chambers.

DESCRIPTION OF THE PREFERRED EMBODIMENTS

As substrates to be processed are processed in a vacuum processing apparatus, reaction products adhere to and are deposited in vacuum processing chambers. The reaction products adhering to and deposited in the vacuum processing chambers are removed by disposing dummy wafers inside the vacuum processing chambers and by conducting dry-cleaning. To carry out dry cleaning, the timings of dry cleaning of the vacuum processing chambers are determined and during or after the processing of a predetermined number of substrates to be processed, dummy substrates are conveyed by substrate conveyor means from dummy substrate storage means disposed in the air atmosphere together with processed substrate storage means, and are then disposed inside the vacuum processing chambers. After the dummy substrates are thus disposed, a plasma is generated inside each of the vacuum processing chambers to execute dry-cleaning inside the vacuum processing chamber. After dry-cleaning inside the vacuum processing chambers is completed, the dummy substrates are returned from the vacuum processing chambers to the dummy substrate storage means by the substrate conveyor means. In this manner, a preliminary vacuum chamber and an exclusive transfer mechanism both necessary in prior art techniques become unnecessary, and the apparatus structure gets simplified. The dummy substrates used for the dry-cleaning and the substrates to be processed do not co-exist inside the same chamber, so that contamination of substrates to be processed due to dust and remaining gas is prevented and a high production yield can be achieved.

Hereinafter, an embodiment of the present invention will be explained with reference to FIGS. 1 and 2.

Figure 1:
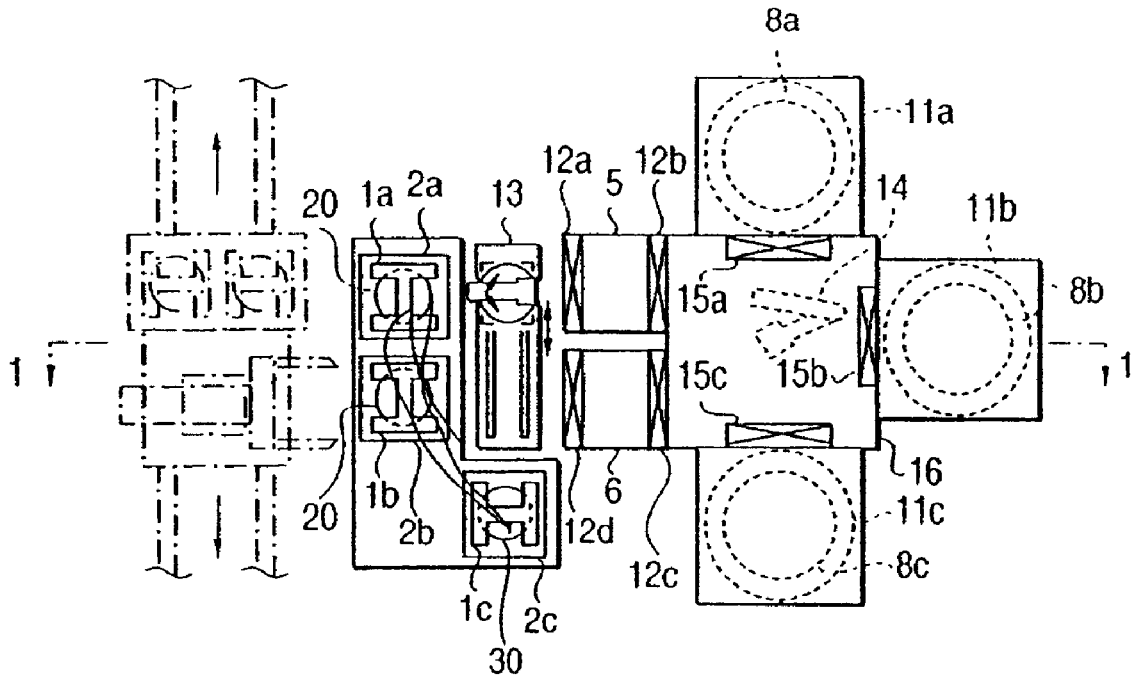
FIG. 1 is a plan view of a dry etching apparatus as an embodiment of a vacuum processing apparatus in accordance with the present invention.
Figure 2:
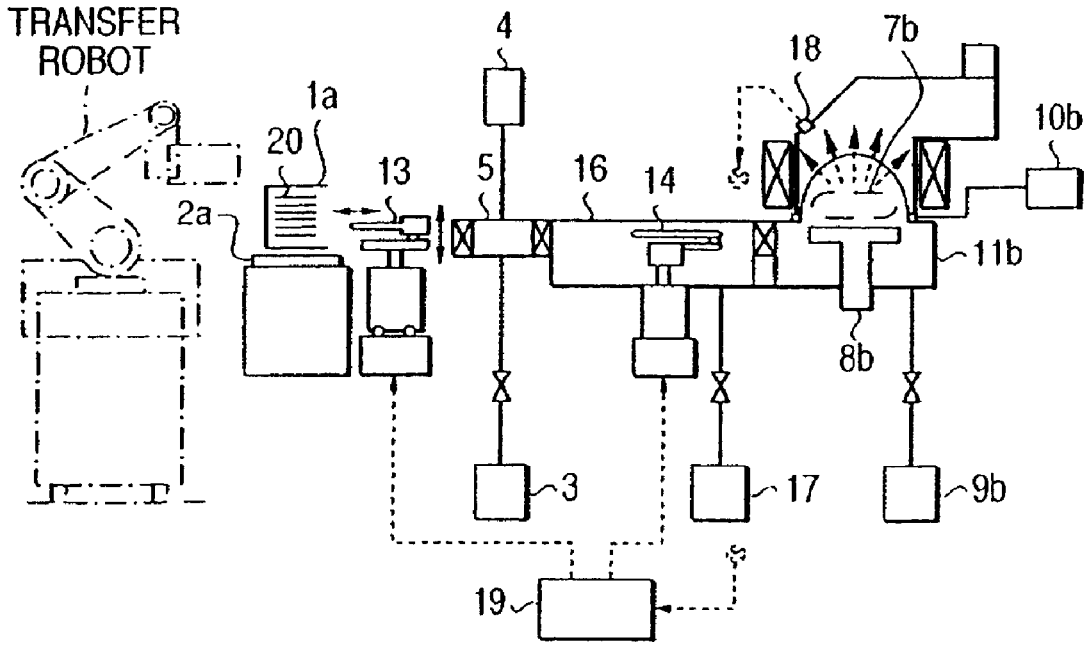
FIG. 2 is a vertical sectional view taken along line 1-1 of FIG. 1.

FIGS. 1 and 2 show a vacuum processing apparatus of the present invention which is, in this case, a dry-etching apparatus for etching wafers, i.e., substrates to be processed by plasma.

Cassette tables 2a to 2c are disposed in an L-shape in this case in positions such that they can be loaded into and unloaded from the apparatus without changing their positions and postures. In other words, the cassettes 1a to 1c are fixed always in predetermined positions on a substantially horizontal plane, while the cassette tables 2a and 2b are disposed adjacent to and in parallel with each other on one of the sides of the L-shape. The cassette table 2c is disposed on the other side of the L-shape. The cassettes 1a and 1b are for storing unprocessed wafers and for recovering the processed wafers. They can store a plurality (usually 25) of wafers 20 as the substrates to be treated. The cassette 1c in this case is for storing the dummy wafers for effecting dry-cleaning using plasma (hereinafter referred to as "plasma-cleaning") and recovering the dummy wafers after plasma-cleaning. It can store a plurality of (usually twenty-five pieces) dummy wafers 30.

A load lock chamber 5 and unload lock chamber 6 are so disposed as to face the cassette tables 2a and 2b, and a conveyor 13 is disposed between the cassette tables 2a, 2b and the load lock chamber 5 and the unload lock chamber 6. The load lock chamber 5 is equipped with an evacuating device 3 and a gas introduction device 4, and can load unprocessed wafers in the vacuum apparatus through a gate valve 12a. The unload lock chamber 6 is similarly equipped with the evacuating device 3 and the gas introduction device 4, and can take out processed wafers to the atmosphere through a gate valve 12d. The conveyor 13 is equipped with a robot having X, Y, Z and θ axes, which operates so as to deliver and receive the wafers 20 between the cassettes 1a, 1b and the load lock and unload lock chambers 5 and 6 and the dummy wafers 30 between the cassette 1c and the load lock and unload lock chambers 5 and 6.

The load lock chamber 5 and the unload lock chamber 6 are connected to a transfer chamber 16 through the gate valves 12b and 12c. The transfer chamber 16 is rectangular, in this case, and etching chambers 11a, 11b and 11c are disposed on the three side walls of the transfer chamber 16 through gate valves 15a, 15b and 15c, respectively. A conveyor 14 capable of delivering the wafers 20 or the dummy wafers 30 from the load lock chamber 5 to the etching chambers 11a, 11b, 11c and of delivering them from the chambers 11a, 11b, 11c to the unload lock chamber 6 is disposed inside the transfer chamber 16. The transfer chamber 16 is equipped with an evacuating device 17 capable of independent evacuation.

The etching chambers 11a, 11b, 11c have the same structure and can make the same processing. The explanation will be given on the etching chamber 11 by way of example. The etching chamber 11b has a sample table 8b for placing the wafers 20 thereon, and a discharge chamber is so provided as to define a discharge portion 7b above the sample table 8b. The etching chamber 11b includes a gas introduction device 10b for introducing a processing gas in the discharge portion 7b and an evacuating device 9b for decreasing the internal pressure of the etching chamber 11b to a predetermined pressure. The etching chamber 11b further includes generation means for generating a microwave and a magnetic field for converting processing gas in the discharge portion 7b to plasma.

A sensor 18 for measuring the intensity of plasma light is disposed at an upper part of the etching chamber. The measured value of the sensor 13 is inputted to a controller 19. The controller 19 compares the measured value from the sensor 18 with a predetermined one and determines the timing of cleaning inside the etching chamber. The controller 19 controls the conveyors 13 and 14 to control the transfer of the dummy wafers 30 between the cassette 1c and the etching chambers 11a to 11c.

In a vacuum processing apparatus having the construction described above, the cassettes 1a, 1b storing unprocessed wafers are first placed onto the cassette tables 2a, 2b by a line transfer robot which operates on the basis of the data sent from a host control apparatus, or by an operator. On the other hand, the cassette 1c storing the dummy wafers is placed on the cassette table 2c. The vacuum processing apparatus executes the wafer processing or plasma cleaning on the basis of recognition by itself of the production-data provided on the cassettes 1a to 1c, of the data sent from the host control apparatus, or of the command inputted by an operator.

For instance, the wafers 20 are sequentially loaded in the order from above into the etching chambers 11a, 11b, 11c by the conveyors 13 and 14, and are etched. The etched wafers are stored in their original positions inside the cassette 1a by the conveyors 14 and 13. In this case, from the start to the end of the operation, without changing the position and posture of the cassettes, the unprocessed wafers are taken out from the cassettes and are returned in their original positions where the wafers have been stored, and are stored there. In this manner, the apparatus can easily cope with automation of the production line, contamination of the wafers due to dust can be reduced and high production efficiency and high production yield can thus be accomplished.

As etching is repeated, the reaction products adhere to and are deposited on the inner wall of the etching chambers 11a to 11c. Therefore, the original state must be recovered by removing the adhering matters by plasma cleaning. The controller 19 judges the timing of this plasma cleaning. In this case, a portion through which the plasma light passes is provided in each of the etching chambers 11a to 11c. The sensor 18 measures the intensity of the plasma light passing through this portion and when the measured value reaches a predetermined one, the start timing of plasma cleaning is judged. Alternatively, the timing of plasma cleaning may be judged by counting the number of wafers processed in each etching chamber by the controller 19 and judging the timing when this value reaches a predetermined value. The actual timing of plasma cleaning that is carried out may be during a processing of a predetermined number of wafers in the cassette 1a or 1b, after the processing of all the wafers 20 in a cassette is completed and before the processing or wafers in the next cassette.

Plasma cleaning is carried out in the following sequence. In this case, the explanation will be given about a case where the etching chambers 11a to 11c are subjected to plasma cleaning by using three dummy wafers 30 among the dummy wafers 30 (twenty-five dummy wafers are stored in this case) stored in the cassette 1c.

Dummy wafers 30 which are stored in the cassette 1c and are not used yet or can be used because the number of times of use for plasma cleaning is below a predetermined one are drawn by the conveyor 13. At this time, dummy wafers 30 stored in any position in the cassette 1c may be used but in this case, the position numbers of the dummy wafers in the cassette and their number of times of use are stored in the controller 19, and accordingly dummy wafers having smaller numbers of times of use are drawn preferentially. Then, the dummy wafers 30 are loaded in the load lock chamber 5 disposed on the opposite side to the cassette 1a by the conveyor 13 through the gate valve 12a in the same way as the transfer at the time of etching of wafers 20. After the gate valve 12a is closed, the load lock chamber 5 is evacuated to a predetermined pressure by the vacuum exhaust device 3 and then the gate valves 12b and 15a are opened. The dummy wafers 30 are transferred by the conveyor 14 from the load lock chamber 5 to the etching chamber 11a through the transfer chamber 16 and are placed on the sample table 8a. After the gate valve 15a is closed, plasma cleaning is carried out in the etching chamber 11a in which the dummy wafers 30 are disposed, under a predetermined condition.

In the interim, the gate valves 12a, 12b are closed and the pressure of the load lock chamber 5 is returned to the atmospheric pressure by the gas introduction device 4. Next, the gate valve 12a is opened and the second dummy wafer 30 is loaded in the load lock chamber 5 by the conveyor 13 in the same way as the first dummy wafer 30, and evacuation is effected again by the evacuating device 3 to a predetermined pressure after closing the gate valve 12a. Thereafter, the gate valves 12b and 15b are opened and the second dummy wafer 30 is transferred from the load lock chamber 5 to the etching chamber 11b through the transfer chamber 16 by the conveyor 14. Plasma cleaning is started after the gate valve 15b is closed.

In the interim, the third dummy wafer 30 is transferred into the etching chamber 11c in the same way as the second dummy wafer 30 and plasma cleaning is carried out.

After plasma cleaning is completed in the etching chamber 11a in which the first dummy wafer 20 is placed, the gate valves 15a and 12c are opened. The used dummy wafer 30 is transferred from the etching chamber 11a to the unload lock chamber 6 by the conveyor 14. Then, the gate valve 12c is closed. After the pressure of the unload lock chamber 6 is returned to the atmospheric pressure by the gas introduction device 4, the gate valve 12d is opened. The used dummy wafer 30 transferred to the unload lock chamber 6 is taken out in the air by the conveyor 13 through the gate valve 12d and is returned to its original position in the cassette 1c in which it is stored at the start.

When plasma cleaning of the etching chambers 11b and 11c is completed, the second and third dummy wafers 20 are returned to their original positions in the cassette 1c.

In this way, the used dummy wafers 30 are returned to their original positions in the cassette 1c and the dummy wafers 30 are always stocked in the cassette 1c. When all the dummy wafers 30 in the cassette 1c are used for plasma cleaning or when the numbers of times of use of the wafers 30 reach the predetermined ones after the repetition of use, the dummy wafers 30 are replaced as a whole together with the cassette 1c. The timing of this replacement of the cassette is managed by the controller 19 and the replacement is instructed to the host control apparatus for controlling the line transfer robot or to the operator.

Although the explanation given above deals with the case where the etching chambers 11a to 11c are continuously plasma-cleaned by the use of three dummy wafers 30 among the dummy wafers 30 in the cassette 1c, other processing methods may be employed, as well.

For example, the etching chambers 11a to 11c are sequentially plasma-cleaned by the use of one dummy wafer 30. In the case of such plasma cleaning, unprocessed wafers 20 can be etched in etching chambers other than the one subjected to plasma cleaning, and plasma cleaning can thus be carried out without interrupting etching.

If the processing chambers are different, for example, there are an etching chamber, a post-processing chamber and a film-formation chamber, and wafers are sequentially processed while passing through each of these processing chambers, each of the processing chambers can be subjected appropriately to plasma cleaning by sending dummy wafers 30 during the processing of the wafers 20 which are stored in the cassette 1a or 2a and drawn and sent sequentially, by passing merely the dummy wafers 30 through the processing chambers for which plasma cleaning is not necessary, and by executing plasma cleaning only when the dummy wafers 30 reach the processing chambers which need plasma cleaning.

According to the embodiment described above, the cassette storing the dummy wafers and the cassettes storing the wafers to be processed are disposed together in the air, the dummy wafers are loaded from the cassette into the apparatus by the same conveyor as the conveyor for transferring the wafers, at the time of cleaning, and the used dummy wafers are returned to their original positions in the cassette. In this way, a mechanism for conducting exclusively plasma cleaning need not be provided, and the construction of the apparatus can be simplified. It is not necessary to handle plasma cleaning as a particular processing sequence, but the plasma cleaning can be incorporated in an ordinary etching processing and can be carried out efficiently in a series of operations.

The dummy wafers used for plasma cleaning are returned to their original positions in the cassette placed in the air. Accordingly, the used dummy wafers and the wafers before and after processing do not exist mixedly in the vacuum chamber, so that contamination of wafers due to dust and remaining gas does not occur unlike conventional apparatuses.

The used dummy wafers are returned to their original positions in the cassette and the numbers of times of their use is managed. Accordingly, it is possible to prevent the confusion of the used dummy wafers with the unused dummy wafers and the confusion of the dummy wafers having small numbers of times of use with the dummy wafers having large numbers of times of use. For these reasons, the dummy wafers can be used effectively without any problem when plasma cleaning is carried out.

Furthermore, in accordance with the present invention, the apparatus can have a plurality of processing chambers and can transfer wafers and dummy wafers by the same conveyor. Since plasma cleaning can be carried out by managing the timing of cleaning of each processing chamber by the controller, the cleaning cycle can be set arbitrarily, dry cleaning can be carried out without interrupting the flow of the processing, the processing can be efficiently made and the productivity can be improved.

As described above, according to the present invention, there are effects that the construction of the apparatus is simple, the substrates to be processed are free from contamination and the production yield is high.

What is claimed is:

1. Sample processing apparatus, comprising:

a cassette table exposed to a cassette-transferring atmosphere, for mounting a cassette to store plural samples, an atmospheric transferring device, for transferring a sample in said cassette in an atmospheric condition, said cassette being mounted on said cassette table;

a locking mechanism for changing over from the atmospheric condition to a reduced pressure condition as compared to the atmospheric condition, or changing over the reduced pressure condition to the atmospheric condition;

a vacuum transferring chamber coupled to said locking mechanism, for transferring said sample in a vacuum condition; and plural vacuum processing chambers, connected to said vacuum transferring chamber, for processing said plural samples, wherein said sample in said cassette is carried into any vacuum processing chamber, of said plural vacuum processing chambers, by way of said atmospheric transferring device, said locking mechanism, and said vacuum transferring chamber, a surface of said sample being maintained substantially horizontal while being carried into the vacuum processing chamber and processed therein, and wherein said sample which has been processed in said vacuum processing chamber is carried out, to a cassette mounted on said cassette table, with said surface of the sample being maintained horizontal.

2. Sample processing apparatus according to claim 1, wherein said sample which has been proposed is returned to said cassette from which said sample has been transferred by said atmospheric transferring device.

3. Sample processing apparatus according to claim 2, wherein said sample which has been processed is returned to the original position of said cassette from which said sample has been transferred by said atmospheric transferring device.

4. Sample processing apparatus, comprising:

a cassette table exposed to a cassette-transferring atmosphere, for mounting a cassette to store plural samples, an atmospheric transferring device for transferring a sample in said cassette in an atmospheric condition, said cassette being mounted on said cassette table;

a load locking mechanism for changing over from the atmospheric condition to a reduced pressure condition as compared to the atmospheric condition;

a vacuum transferring chamber coupled to said load locking mechanism under the reduced pressure condition, for transferring said sample from said load locking mechanism to at least one of plural vacuum processing chambers connected to said vacuum transferring chamber, for processing said plural samples; and an unload locking mechanism for changing over the reduced pressure condition to the atmospheric condition, said unload locking mechanism receiving under the reduced pressure condition the sample which has been processed in said at least one of plural vacuum processing chambers from said vacuum transferring chamber and supplying the sample, which has been processed, under the atmospheric condition to said cassette on said cassette table, wherein said sample in said cassette is carried into any vacuum processing chamber, of said plural vacuum processing chambers, by way of said atmospheric transferring device, said load locking mechanism, and said vacuum transferring chamber, a surface of said sample being maintained substantially horizontal while being carried into the vacuum processing chamber and processed therein, and wherein said sample which has been processed in said vacuum processing chamber is carried out, to said cassette mounted on said cassette table, by way of said vacuum transferring chamber, said unload locking mechanism, and said atmospheric transferring device, while said surface of the sample is maintained horizontal.

5. Apparatus for treating at least one wafer by processing in at least one of a plurality of vacuum processing chambers, comprising:

(i) a cassette table exposed to the air, on which is placed a cassette containing at least one wafer to be processed, with a surface of the at least one wafer being horizontal;

(ii) a loading mechanism for loading said at least one wafer sequentially in order from said cassette by means including a first conveyor, a locking mechanism, and a second conveyor in a transfer chamber under vacuum, into said at least one of the plurality of vacuum processing chambers connected to said transfer chamber, said loading mechanism loading said at least one wafer into said at least one of said vacuum processing chambers such that said surface to be processed is horizontal when processed in the vacuum processing chamber; and (iii) an unloading mechanism for unloading processed wafers sequentially in order from said vacuum processing chamber into said cassette on said cassette table, by means including said second conveyor in said transfer chamber under vacuum, said locking mechanism, and said first conveyor.

6. A method of transferring a sample, using a cassette table for mounting a cassette, said cassette table being exposed to a cassette-transferring atmosphere, the method comprising the steps of:

carrying in said samples in said cassette which is mounted on said cassette table, to a locking mechanism in an atmospheric condition by use of an atmospheric transferring device;

changing over said locking mechanism from the atmospheric condition to a reduced pressure condition as compared to the atmospheric condition;

carrying in, one by one, said samples in said locking mechanism to a transferring chamber, by use of a vacuum transferring device which is installed in said transferring chamber;

processing, one by one, said samples carried into said transferring chamber, in a vacuum processing chamber of plural vacuum processing chambers;

carrying out samples processed in said vacuum processing chamber, to said locking mechanism in the reduced pressure condition, by use of said vacuum transferring device;

changing over said locking mechanism from the reduced pressure condition to the atmospheric condition; and carrying out, said samples in said locking mechanism, to said cassette mounted on said cassette table, by use of said atmospheric transferring device, wherein, during a time that said samples are carried, and during a processing time of said samples, a same surface of the samples is maintained substantially horizontal.

7. A wafer surface processing system, comprising:

a cassette table for mounting a cassette, said cassette table being exposed to a cassette-transferring atmosphere;

a plurality of surface processing chambers, each having a gate, that are arrayed about a spatial locus in such a way that the gates are accessible from a single location spaced from said gates, for processing a surface of a wafer provided in each surface processing chamber, each of the plurality of surface processing chambers having a wafer support such that said surface of the wafer is horizontal when the surface is being processed in the surface processing chamber;

a pair of wafer holding chambers spaced from the plural processing chambers along the spatial locus, for temporarily holding said wafer therein, one of said wafer holding chambers having a gate through which said wafer to be processed is transferred out of the one wafer holding chamber, the other of said wafer holding chambers having a gate through which said wafer which has been processed is transferred into the other wafer holding chamber; and a first wafer transfer structure rotatably fixed at said single location, for transferring said wafer through said gates of said processing and holding chambers.

8. The wafer surface processing system according to claim 7, further comprising a structure to provide a vacuum in each of the surface processing chambers during processing.

9. The wafer surface processing system according to claim 7, wherein each of said wafer holding chambers and said first wafer transfer structure includes wafer support structure such that the surface of the wafer is held horizontal by the wafer support structure.

10. A wafer surface processing system comprising:

a cassette table for mounting a cassette, said cassette table being exposed to a cassette-transferring atmosphere;

a plurality of surface processing chamber structures, each having a gate, that are arrayed about a spatial locus in such a way that said gates are accessible from a single location spaced from the gates, for processing a surface of a wafer provided in the plurality of surface processing chamber structures, each of the plurality of surface processing chamber structures having a wafer support such that said surface of the wafer is horizontal when the surface is being processed in a surface processing chamber structure, of the plurality of surface processing chamber structures;

a surface non-processing chamber structure spaced from the plurality of surface processing chamber structures along the same spatial locus and having first and second gates, for temporarily holding said wafer therein, said wafer to be processed being transferred into the surface non-processing chamber structure from outside thereof through said first gate and further transferred to one of said surface processing chamber structures through said second gate, and said wafer having been processed in any of said surface processing chamber structures being transferred from the surface processing chamber structure in which the wafer had been processed, through said second gate into the surface non-processing chamber structure and further transferred outside thereof through said first gate.

11. A wafer surface processing system, comprising:

a cassette table for mounting a cassette, said cassette table being exposed to a cassette-transferring atmosphere;

a plurality of surface processing chambers, each having a gate, that are arrayed about a spatial locus in such a way that the gates thereof are accessible from a single location spaced from the gates, for processing a surface of a wafer provided in a surface processing chamber of the plurality of surface processing chambers, the plurality of surface processing chambers having wafer supports such that said surface of the wafer is horizontal when the surface is being processed in the surface processing chamber;

a wafer buffering structure spaced from the plural surface processing chambers along the spatial locus and having first and second gates, for temporarily holding said wafer therein;

a first wafer transfer structure rotatably fixed at said single location, for transferring a wafer between said buffering structure and the plurality of surface processing chambers, through said gates of said surface processing chambers and said first gate of said wafer buffering structure; and a second wafer transfer structure for transferring said wafer through said second gate of said wafer buffer structure, between said cassette and said wafer buffering structure.

12. A wafer surface processing system, comprising:

a cassette table for mounting a cassette, said cassette table being exposed to a cassette-transferring atmosphere;

a plurality of surface processing chambers arrayed about a spatial locus in such a way that said processing chambers are accessible from a single location spaced from said processing chambers, for processing a surface of a wafer provided in a surface processing chamber of the plurality of surface processing chambers, each of the plurality of surface processing chambers having a wafer support such that said surface of the wafer is horizontal when the surface is being processed in the surface processing chamber;

first and second buffer chambers for holding said wafer therein without processing said surface of said wafer; and a first wafer transfer structure for selectively transferring said wafer between two chambers, of all said surface processing chambers and said buffer chambers; and a second wafer transfer structure for transferring said wafer between a cassette disposed outside said spatial locus, under an atmospheric condition, and at least one of said first and second buffer chambers.

13. A wafer surface processing system, comprising:

a plurality of processing structures, arrayed about a spatial locus in such a way that said processing structures are accessible from a single location spaced from said processing structures, for processing a surface of a wafer provided in a processing structure of the plurality of processing structures;

a buffer structure along said spatial locus, for holding said wafer therein without processing said surface of said wafer;

a first wafer transfer structure for selectively transferring said wafer between two of said processing and buffer structures;

a second wafer transfer structure arranged between said buffer structure and a cassette disposed at a location outside said spatial locus and opposed to said buffer structure, for transferring said wafer between said cassette and said buffer structure; and a cassette transfer structure for transferring said cassette and positioning it at said location.

14. A wafer surface processing system according to claim 13, wherein the plurality of processing structures have wafer supports such that said surface of the wafer is horizontal when the surface is being processing in said processing structure.

15. A wafer surface processing system, comprising:

a plurality of processing chambers arrayed about a spatial locus in such a way that said processing chambers are accessible from a single location spaced from said processing chambers, for processing a surface of a wafer provided in a processing chamber of the plurality of processing chambers, the plurality of processing chambers having wafer supports such that said surface of the wafer is horizontal when the surface is being processed in the processing chamber;

first and second buffer chambers along the spatial locus, for holding said wafer therein without processing said surface of said wafer;

a first wafer transfer structure for selectively transferring said wafer between two chambers, of all said processing and buffer chambers;

a second wafer transfer structure arranged between at least one of said first and second buffer chambers and a cassette disposed at a location outside said spatial locus and opposed to said at least one of said first and second buffer chambers, for transferring said wafer between said cassette and said at least one of said first and second buffer chambers; and a cassette transfer structure for transferring and positioning said cassette at said location.

16. A method of transferring a sample, comprising the steps of:

carrying in samples from a sample holder which is supported by a support and which is in a first atmosphere, to a locking mechanism in an atmospheric condition, by use of an atmospheric transferring device;

changing over said locking mechanism from the atmospheric condition to a reduced pressure condition as compared to the atmospheric condition;

carrying in, one by one, said samples in said locking mechanism to a transferring structure, by use of a transferring device which is located at said transferring structure;

processing, one by one, said samples carried into said transferring structure, in a processing device of plural processing devices, the plural processing devices being positioned around the transferring structure;

carrying out, one by one, samples processed in said processing device, to said locking mechanism in the reduced pressure condition, by use of said transferring device;

changing over said locking mechanism from the reduced pressure condition to the atmospheric condition; and carrying out said samples in said locking mechanism, to a sample holder supported by a support, by use of said atmospheric transferring device, wherein, during a processing time of said samples, a surface of each sample being processed is maintained substantially horizontal.

17. Apparatus for transferring a sample, comprising:

a sample holder for holding a sample, said sample holder being exposed to a transferring atmosphere, said sample holder being supported by a support;

an atmospheric transferring device for transferring a sample in said sample holder exposed to said transferring atmosphere;

a locking mechanism for changing over from an atmospheric condition to a reduced pressure condition as compared to the atmospheric condition, or changing over the reduced pressure condition to the atmospheric condition;

a transferring structure in communication with said locking mechanism and to which said sample is transferred;

a second transferring device located at said transferring structure and for transferring said sample; and plural processing devices connected to said transferring structure and for processing said plural samples under reduced pressure conditions, wherein said sample in said sample holder is carried into any processing device, of said plural processing devices, by way of said atmospheric transferring device, said locking mechanism, and said second transferring device located at said transferring structure, wherein a surface, of said sample, being processed is maintained substantially horizontal while being processed in the processing device, and wherein said sample which has been processed in said processing device is carried out, to a sample holder supported by said support, by way of said second transferring device, said locking mechanism, and said atmospheric transferring device.

18. A method of operating a wafer transfer system for reduced pressure processing devices, comprising:

an atmospheric loading step for transferring a wafer, stored with a surface thereof, to be processed in one of the reduced pressure processing devices, horizontal in a wafer holder placed at a supporting position, to a locking mechanism under atmospheric condition;

a reduced pressure loading step for transferring said wafer to said reduced pressure processing device from said locking mechanism under a reduced pressure condition as compared to the atmospheric condition;

a processing step for processing said wafer in said reduced pressure processing device with said surface being horizontal;

an unloading step for transferring said wafer from said reduced pressure processing device to said locking mechanism under the reduced pressure condition; and an atmospheric unloading step for transferring said wafer from said locking mechanism under the atmospheric condition to said wafer holder and storing said wafer with its surface horizontal in said wafer holder.

19. A method of treating at least one wafer under reduced pressure processing conditions, comprising the steps of:

(i) placing a wafer holder, containing at least one wafer, at a support, exposed to first atmospheric conditions:

(ii) loading said at least one wafer from said wafer holder by means including a first conveyor, a locking mechanism, and a second conveyor in a transfer structure under reduced pressure conditions, into at least one of a plurality of reduced pressure processing devices in communication with said transfer structure, said reduced pressure conditions being a reduced pressure as compared to the first atmospheric conditions;

(iii) processing under reduced pressure conditions said at least one wafer in said at least one of the plurality of reduced pressure processing devices, with a surface of the at least one wafer, to be processed, being horizontal; and (iv) unloading processed wafers from said reduced pressure processing chambers into said wafer holder at said support, by means including said second conveyor in said transfer structure under reduced pressure, said locking mechanism, and said first conveyor.

20. A wafer transfer system for multi-device configuration, comprising:

a plurality of processing devices positioned around a periphery of a structure in such a way that said processing devices are accessible from a single location spaced from said processing devices, for processing a surface of a wafer provided in a processing device of the plurality of processing devices, each of the plurality of processing devices having a wafer support such that said surface of the wafer is horizontal when the surface is being processed in the processing device;

first and second buffer zones along the periphery of the structure, for holding said wafer therein *transferred from a cassette disposed in an atmospheric condition* without processing the surface of the wafer therein; and a wafer transfer structure for transferring said wafer between two of said devices and zones.

21. A wafer transfer system for multi-device configuration, comprising:

a cassette table for mounting a cassette in an atmosphere;

a plurality of processing devices positioned around a periphery of a structure in such a way that said processing devices are accessible from a single location spaced from said processing devices, for processing a surface of a wafer provided in a processing device of the plurality of processing devices, each of the plurality of processing devices having a wafer support such that said surface of the wafer is horizontal when the surface is being processed in the processing device;

first and second buffer zones along the periphery of the structure, for holding said wafer therein without processing the surface of the wafer therein;

a wafer transfer structure for selectively transferring said wafer between two of said devices and zones; and another wafer transfer structure for transferring said wafer between said cassette and one of said buffer zones.

22. Apparatus for a wafer transfer system for a processing device for processing a wafer under reduced pressure conditions, comprising:

a first transfer mechanism connected to said processing device at one side of the processing device, for transferring said wafer into, and out of, said processing device, said surface to be processed being horizontal when transferred into, and out of, said processing device, and such that said surface is horizontal when processed in the processing device;

a locking mechanism having a reduced pressure side in communication with said first transfer mechanism and having an atmospheric side, for transferring said wafer between said reduced pressure side and said atmospheric side, transfer of said wafer into the locking mechanism being performed under both reduced pressure and atmospheric conditions; and an atmospheric transfer mechanism, connected between the atmospheric side of said locking mechanism and a wafer holder, for transferring said wafer between said wafer holder and said locking mechanism, said locking mechanism being connected to said first transfer mechanism and disconnected from said atmospheric transfer mechanism when said locking mechanism is under reduced pressure conditions, and is disconnected from said first transfer mechanism and connected to said atmospheric transfer mechanism when said locking mechanism is under atmospheric conditions, wherein said locking mechanism has openings on both sides thereof connected to the first transfer mechanism and the atmospheric transfer mechanisms.

23. A method of transferring a sample, comprising the steps of:

carrying in samples, from a position of a sample holder which is supported by a support and which is in a first atmosphere, to a locking mechanism in an atmospheric condition, by use of an atmospheric transferring device;

changing over said locking mechanism from the atmospheric condition to a reduced pressure condition as compared to the atmospheric condition;

carrying in, one by one, said samples in said locking mechanism, to a transferring structure, by use of a transferring device which is located at said transferring structure;

processing, one by one, said samples carried into said transferring structure, in a processing device of plural processing devices, the plural processing devices being positioned around the transferring structure;

carrying out, one by one, samples processed in said processing device, to said locking mechanism in the reduced pressure condition, by use of said transferring device;

changing over said locking mechanism from the reduced pressure condition to the atmospheric condition; and carrying out said samples in said locking mechanism, to a sample holder supported by a support, by use of an atmospheric transferring device, wherein said samples are carried out from said locking mechanism to the original position of the sample holder, and wherein, during a processing time of said samples, a surface of each sample being processed is maintained substantially horizontal.

24. Apparatus for transferring a sample, comprising:

a sample holder for holding a sample in a position, said sample holder being exposed to a transferring atmosphere, said sample holder being supported by a support;

at least one atmospheric transferring device for transferring a sample in said sample holder exposed to said transferring atmosphere;

a locking mechanism for changing over from an atmospheric condition to a reduced pressure condition as compared to the atmospheric condition, or changing over the reduced pressure condition to the atmospheric condition;

a transferring structure in communication with said locking mechanism and to which said sample is transferred;

a second transferring device located at said transferring structure and for transferring said sample in said reduced pressure condition; and plural processing devices connected to said transferring structure and for processing said plural samples under reduced pressure conditions, wherein said sample in said sample holder is carried into any processing device, of said plural processing devices, by way of said at least one atmospheric transferring device, said locking mechanism, and said second transferring device located at said transferring structure, wherein a surface of said sample being processed is maintained substantially horizontal while being processed in the processing device, and wherein said sample which has been processed in said processing device is carried out to the original position of a sample holder supported by a support, by way of said second transferring device which is located at said transferring structure, said locking mechanism, and said atmospheric transferring device.

25. A method of treating at least one wafer under reduced pressure processing conditions, comprising the steps of:

(i) placing a wafer holder, containing at least one wafer in each position thereof, at a support, exposed to first atmospheric conditions;

(ii) loading said at least one wafer from said wafer holder by means including at least one first conveyor, a locking mechanism, and a second conveyor in a transfer structure under reduced pressure conditions, into at least one of a plurality of reduced pressure processing devices in communication with said transfer structure, said reduced pressure conditions being a reduced pressure as compared to the first atmospheric conditions, (iii) processing under reduced pressure conditions said at least one wafer in said at least one of the plurality of reduced pressure processing devices, with a surface of the at least one wafer, to be processed, being horizontal; and (iv) unloading processed wafers from said reduced pressure processing chambers to each original position in the wafer holder, by means including said second conveyor in said transfer structure under reduced pressure, said locking mechanism, and said at least one first conveyor.

* * * * *

UNITED STATES PATENT AND TRADEMARK OFFICE

CERTIFICATE OF CORRECTION

PATENT NO. : RE 39,824 E
APPLICATION NO. : 10/062088
DATED : September 11, 2007
INVENTOR(S) : S. Kato et al.

It is certified that error appears in the above-identified patent and that said Letters Patent is hereby corrected as shown below:

Title Page, at section (22) Filed: delete "Sep. 23, 2002"
and insert -- Feb. 1, 2002 --.

Signed and Sealed this

Ninth Day of June, 2009

John Doll

JOHN DOLL
*Acting Director of the United States Patent and Trademark Office*